United States Patent
Matsumoto

(10) Patent No.: US 9,685,669 B2
(45) Date of Patent: Jun. 20, 2017

(54) POWER GENERATION CHARACTERISTIC ESTIMATION DEVICE FOR FUEL CELL

(75) Inventor: Michihiko Matsumoto, Fujisawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 419 days.

(21) Appl. No.: 14/239,424

(22) PCT Filed: Aug. 14, 2012

(86) PCT No.: PCT/JP2012/070691
§ 371 (c)(1),
(2), (4) Date: Feb. 18, 2014

(87) PCT Pub. No.: WO2013/027634
PCT Pub. Date: Feb. 28, 2013

(65) Prior Publication Data
US 2014/0205923 A1    Jul. 24, 2014

(30) Foreign Application Priority Data

Aug. 23, 2011  (JP) ................. 2011-181540

(51) Int. Cl.
*H01M 8/04* (2016.01)
*G01R 31/36* (2006.01)
(Continued)

(52) U.S. Cl.
CPC .... *H01M 8/04223* (2013.01); *G01R 31/3627* (2013.01); *H01M 8/04253* (2013.01);
(Continued)

(58) Field of Classification Search
CPC ......... H01M 8/04223; H01M 8/04559; H01M 8/04589; H01M 8/04619; H01M 8/04365;
(Continued)

(56) References Cited

U.S. PATENT DOCUMENTS

| 7,882,051 B2 | 2/2011 | Matsumoto et al. |
| 8,815,463 B2 | 8/2014 | Katano et al. |

(Continued)

FOREIGN PATENT DOCUMENTS

| JP | 2004-349114 A | 12/2004 |
| JP | 2006-269223 A | 10/2006 |

(Continued)

OTHER PUBLICATIONS

European Extended Search Report, Jan. 22, 2015, 7 pages.
Japanese Office Action, Sep. 30, 2014, 4 pages.

*Primary Examiner* — Milton I Cano
*Assistant Examiner* — Michael Dignan
(74) *Attorney, Agent, or Firm* — Foley & Lardner LLP

(57) ABSTRACT

A power generation characteristic estimation device for fuel cell includes a reference characteristic setting unit for setting a reference power generation characteristic of a fuel cell, a current detection unit for detecting an actual current of the fuel cell, a voltage detection unit for detecting an actual voltage of the fuel cell, and a characteristic estimation unit for estimating an actual power generation characteristic of the fuel cell based on a voltage difference between a voltage on the reference power generation characteristic and an actual voltage at the actual current. The characteristic estimation unit estimates the power generation characteristic during a warm-up operation of the fuel cell when a pressure of a gas supplied to the fuel cell is not lower than a predetermined value.

8 Claims, 12 Drawing Sheets

(51) Int. Cl.
*H01M 8/04223* (2016.01)
*H01M 8/0438* (2016.01)
*H01M 8/04537* (2016.01)
*H01M 8/0432* (2016.01)
*H01M 8/04955* (2016.01)
*H01M 8/04746* (2016.01)
*H01M 8/04119* (2016.01)

(52) U.S. Cl.
CPC ... *H01M 8/04268* (2013.01); *H01M 8/04365* (2013.01); *H01M 8/04395* (2013.01); *H01M 8/04559* (2013.01); *H01M 8/04589* (2013.01); *H01M 8/04619* (2013.01); *H01M 8/04753* (2013.01); *H01M 8/04955* (2013.01); *H01M 8/04156* (2013.01); *H01M 8/04649* (2013.01); *H01M 2250/20* (2013.01); *Y02T 90/32* (2013.01)

(58) Field of Classification Search
CPC ......... H01M 8/04955; H01M 8/04253; H01M 8/04268; H01M 8/04753; H01M 8/04395; H01M 8/04156; H01M 8/04649; H01M 2250/20; G01R 31/3627
See application file for complete search history.

(56) References Cited

U.S. PATENT DOCUMENTS

| | | | |
|---|---|---|---|
| 2004/0053088 A1* | 3/2004 | Haga | H01M 8/04097 429/412 |
| 2005/0053810 A1* | 3/2005 | Kato | H01M 8/0247 429/429 |
| 2005/0181246 A1* | 8/2005 | Nakaji | B60L 11/1885 429/429 |
| 2006/0073367 A1* | 4/2006 | Kanno | H01M 8/04007 429/413 |
| 2008/0118799 A1* | 5/2008 | Matsumoto | H01M 8/04007 706/45 |
| 2008/0297113 A1 | 12/2008 | Saeki et al. | |
| 2009/0269630 A1 | 10/2009 | Katano et al. | |
| 2010/0068574 A1 | 3/2010 | Naganuma | |
| 2012/0015270 A1 | 1/2012 | Naganuma | |
| 2012/0248872 A1 | 10/2012 | Saeki et al. | |

FOREIGN PATENT DOCUMENTS

| | | |
|---|---|---|
| JP | 2008-34126 A | 2/2008 |
| JP | 2009-54427 A | 3/2009 |
| JP | 2009-123613 A | 6/2009 |
| JP | 2009-259754 A | 11/2009 |
| WO | WO 2011/013226 A1 | 2/2011 |

* cited by examiner

POWER GENERATION CHARACTERISTIC ESTIMATION DEVICE FOR FUEL CELL

This application claims priority to Japanese Patent Application No. 2011-181540, filed on Aug. 23, 2011, the entire contents of which are hereby incorporated by reference.

TECHNICAL FIELD

This invention relates to a device for estimating a power generation characteristic of a fuel cell.

BACKGROUND ART

In JP2006-269223A, an actual power generation characteristic (actual IV characteristic) of a fuel cell is estimated based on a voltage difference $\Delta V(=Vb-Vr)$ between a reference voltage Vb obtained from a reference power generation characteristic (reference IV characteristic) stored for each temperature and an actual voltage Vr. Specifically, since there is a linear relationship "$\Delta V=AI+B$" between a deviation of the actual voltage from the reference power generation characteristic and a current at that time, A and B can be solved by giving two values to each of $\Delta V$ and I. By substituting all currents I into the above relational expression and subtracting the obtained $\Delta V$ from the reference IV characteristic, an actual IV characteristic line can be drawn.

SUMMARY OF INVENTION

However, it was found that $\Delta V$ was not in a linear relationship with the reference IV characteristic in a characteristic on a high load side in a low temperature region. Accordingly, if a technique of patent literature 1 is applied to sub-zero start-up, estimation accuracy on the high load side may possibly become poor.

The present invention was developed, focusing on such a conventional problem. An object of the present invention is to provide a device capable of accurately estimating a power generation characteristic of a fuel cell even in a low temperature region where a warm-up operation is performed.

A power generation characteristic estimation device for fuel cell according to one aspect of the present invention includes a reference characteristic setting unit for setting a reference power generation characteristic of a fuel cell, a current detection unit for detecting an actual current of the fuel cell, a voltage detection unit for detecting an actual voltage of the fuel cell, and a characteristic estimation unit for estimating an actual power generation characteristic of the fuel cell based on a voltage difference between a voltage on the reference power generation characteristic and an actual voltage at the actual current. The characteristic estimation unit estimates the power generation characteristic during a warm-up operation of the fuel cell when a pressure of a gas supplied to the fuel cell is not lower than a predetermined value.

Embodiments of the present invention and advantages thereof are described in detail below together with the accompanying drawings.

DESCRIPTION OF EMBODIMENTS

First Embodiment

Figure 1:
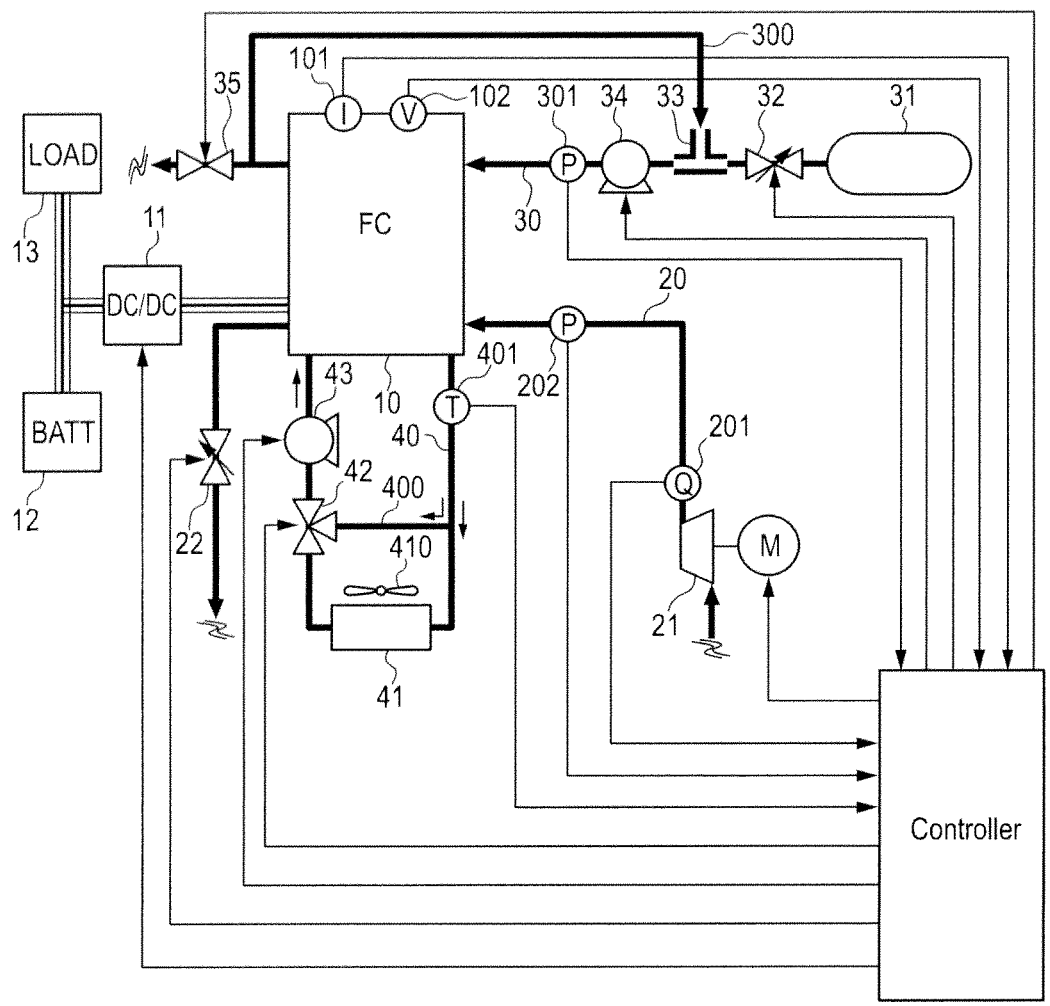
FIG. 1 is a diagram showing an example of a system to which a power generation characteristic estimation device for fuel cell according to the present invention is applied.

FIG. 1 is a diagram showing an example of a system to which a power generation characteristic estimation device for fuel cell according to the present invention is applied.

First, a basic system to which the power generation characteristic estimation device for fuel cell according to the present invention is applied is described with reference to FIG. 1.

A fuel cell stack 10 generates power by being supplied with reaction gases (cathode gas $O_2$, anode gas $H_2$) while being maintained at an appropriate temperature. Accordingly, a cathode line 20, an anode line 30 and a cooling water circulation line 40 are connected to the fuel cell stack 10. It should be noted that a power generation current of the fuel cell stack 10 is detected by a current sensor 101. A power generation voltage of the fuel cell stack 10 is detected by a voltage sensor 102.

The cathode gas $O_2$ supplied to the fuel cell stack 10 flows in the cathode line 20. A compressor 21 and a cathode pressure regulating valve 22 are provided in the cathode line 20.

The compressor 21 is provided upstream of the fuel cell stack 10 in the cathode line 20. The compressor 21 is driven by a motor M. The compressor 21 regulates a flow rate of the cathode gas $O_2$ flowing in the cathode line 20. The flow rate of the cathode gas $O_2$ is regulated by a rotation speed of the compressor 21.

The cathode pressure regulating valve 22 is provided downstream of the fuel cell stack 10 in the cathode line 20. The cathode pressure regulating valve 22 regulates a pressure of the cathode gas $O_2$ flowing in the cathode line 20. The pressure of the cathode gas $O_2$ is regulated by an opening of the cathode pressure regulating valve 22.

The flow rate of the cathode gas $O_2$ flowing in the cathode line 20 is detected by a cathode flow rate sensor 201. This cathode flow rate sensor 201 is provided downstream of the compressor 21 and upstream of the fuel cell stack 10.

The pressure of the cathode gas $O_2$ flowing in the cathode line 20 is detected by a cathode pressure sensor 202. This cathode pressure sensor 202 is provided downstream of the compressor 21 and upstream of the fuel cell stack 10. Further, in FIG. 1, the cathode pressure sensor 202 is located downstream of the cathode flow rate sensor 201.

The anode gas $H_2$ supplied to the fuel cell stack 10 flows in the anode line 30. An anode recirculation line 300 is provided in parallel with the anode line 30. The anode recirculation line 300 is branched off at a position of the anode line 30 downstream of the fuel cell stack 10 and joins the anode line 30 at a position upstream of the fuel cell stack 10. A cylinder 31, an anode pressure regulating valve 32, an ejector 33, an anode pump 34 and a purge valve 35 are provided in the anode line 30.

The anode gas $H_2$ is stored in a highly pressurized state in the cylinder 31. The cylinder 31 is provided on a most upstream side of the anode line 30.

The anode pressure regulating valve 32 is provided downstream of the cylinder 31. The anode pressure regulating valve 32 regulates a pressure of the anode gas $H_2$ newly supplied to the anode line 30 from the cylinder 31. The pressure of the anode gas $H_2$ is regulated by an opening of the anode pressure regulating valve 32.

The ejector 33 is provided downstream of the anode pressure regulating valve 32. The ejector 33 is located at a position where the anode recirculation line 300 joins the anode line 30. The anode gas $H_2$ flowing in the anode recirculation line 300 is mixed with the anode gas $H_2$ newly supplied from the cylinder 31 in this ejector 33.

The anode pump 34 is located downstream of the ejector 33. The anode pump 34 feeds the anode gas $H_2$ having flowed through the ejector 33 to the fuel cell stack 10.

The purge valve 35 is provided downstream of the fuel cell stack 10 and further downstream of the branched-off position of the anode recirculation line 300 in the anode line 30. When the purge valve 35 is opened, the anode gas $H_2$ is purged.

The pressure of the anode gas $H_2$ flowing in the anode line 30 is detected by an anode pressure sensor 301. This anode pressure sensor 301 is provided downstream of the anode pump 34 and upstream of the fuel cell stack 10.

Cooling water supplied to the fuel cell stack 10 flows in the cooling water circulation line 40. A radiator 41, a three-way valve 42 and a water pump 43 are provided in the cooling water circulation line 40. Further, a bypass line 400 is provided in parallel with the cooling water circulation line 40. The bypass line 400 is branched off at a position upstream of the radiator 41 and joins at a position downstream of the radiator 41. Thus, the cooling water flowing in the bypass line 400 bypasses the radiator 41.

The radiator 41 cools the cooling water. The radiator 41 is provided with a cooling fan 410.

The three-way valve 42 is located in a part where the bypass line 400 joins the cooling water circulation line 40. The three-way valve 42 regulates a flow rate of the cooling water flowing in a radiator side line and that of the cooling water flowing in the bypass line according to openings. In this way, the temperature of the cooling water is regulated.

The water pump 43 is located downstream of the three-way valve 42. The water pump 43 feeds the cooling water having flowed through the three-way valve 42 to the fuel cell stack 10.

The temperature of the cooling water flowing in the cooling water circulation line 40 is detected by a water temperature sensor 401. This water temperature sensor 401 is provided upstream of a position where the bypass line 400 is branched off.

Signals of the current sensor 101, the voltage sensor 102, the cathode flow rate sensor 201, the cathode pressure sensor 202, the anode pressure sensor 301 and the water temperature sensor 401 are input to a controller. Then, signals are output from the controller to control the operations of the compressor 21, the cathode pressure regulating valve 22, the anode pressure regulating valve 32, the anode pump 34, the purge valve 35, the three-way valve 42 and the water pump 43.

By such a configuration, the fuel cell stack 10 generates power by being supplied with the reaction gases (cathode gas $O_2$, anode gas $H_2$) while being maintained at an appropriate temperature. The power generated by the fuel cell stack 10 is supplied to a battery 2 and a load 13 via a DC/DC converter 11.

Figure 2:
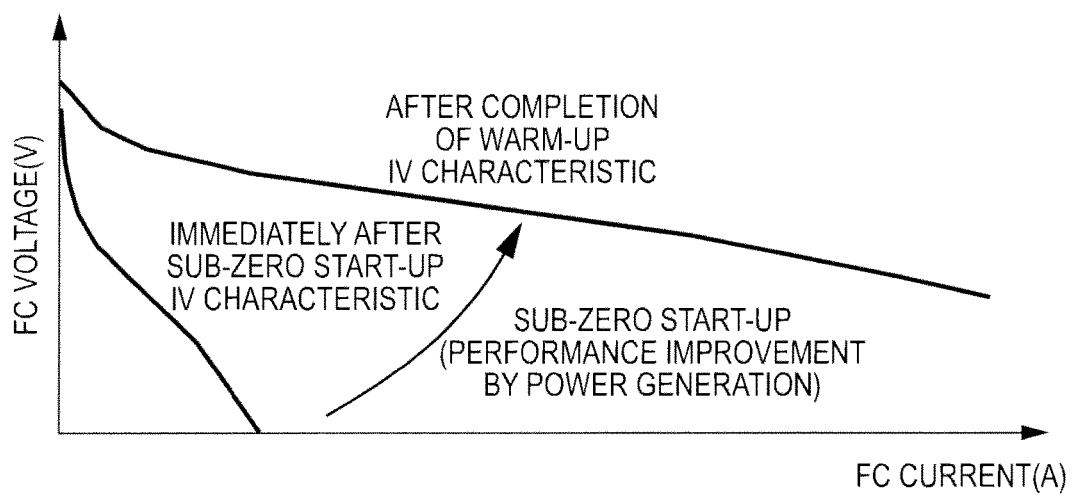
FIG. 2 is a graph showing power generation characteristics of a fuel cell.

FIG. 2 is a graph showing power generation characteristics of a fuel cell.

Here, to facilitate the understanding of the present invention, the power generation characteristics of the fuel cell are described.

The power generation characteristic (current-voltage characteristic: hereinafter, referred to as an "IV characteristic" as appropriate) of the fuel cell in a state after warm-up is completed (steady state) is as shown in FIG. 2 and a large current can also be extracted. During normal travel, the fuel cell is controlled in accordance with this power generation characteristic.

However, the power generation characteristic (IV characteristic) of the fuel cell immediately after sub-zero start-up is as shown in FIG. 2. The power generation characteristic (IV characteristic) of the fuel cell changes through the course of the warm-up.

If an excessive output is requested in a warm-up state (transient state) after the sub-zero start-up, a sufficient output is not supplied from the fuel cell due to a low power generation characteristic of the fuel cell, which leads to excessive discharge of a battery. Accordingly, in the warm-up state (transient state) after the sub-zero start-up, it is desired to control a travel motor so as not to request an excessive output after the power generation characteristic (IV characteristic) of the fuel cell is accurately estimated only by an output to the load (i.e. only with a loco output).

One technique for estimating a power generation characteristic (IV characteristic) of a fuel cell is disclosed in the above patent literature 1. However, with this technique, it was found that $\Delta V$ was not in a linear relationship with a reference IV characteristic in a characteristic on a high load side in a low temperature region. Accordingly, if the technique of patent literature 1 is applied to sub-zero start-up, estimation accuracy on the high load side may possibly become poor.

Figure 3:
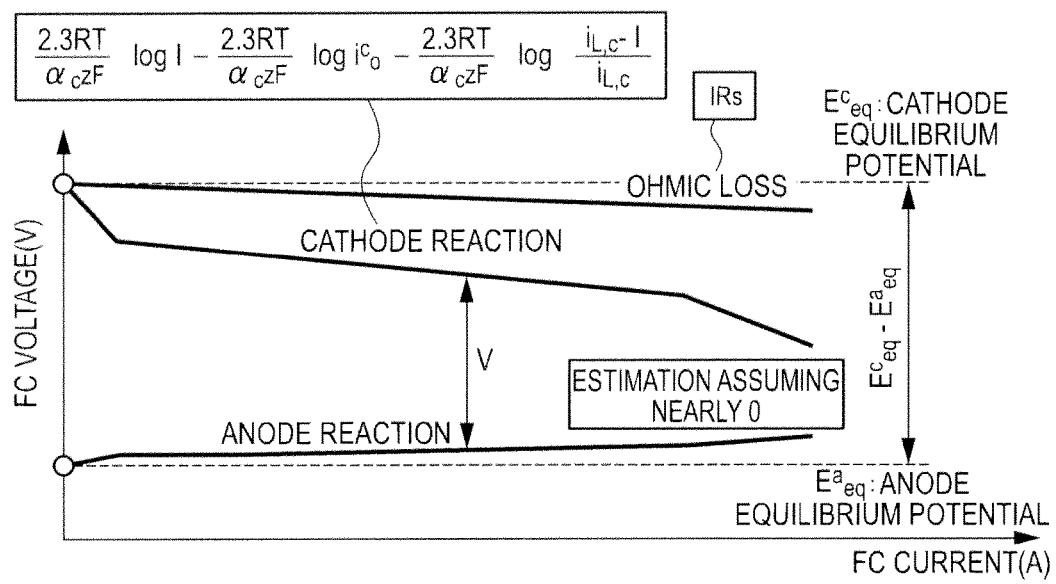
FIG. 3 is a graph showing a general power generation characteristic of a fuel cell.

FIG. 3 is a graph showing a general power generation characteristic of a fuel cell.

The inventor focused on a fact that a power generation characteristic of a fuel cell is generally expressed by the following equation (1). It should be noted that, in this equation (1), an anode reaction sufficiently rapidly proceeds to sufficiently reduce a loss for a cathode reaction,

[Equation 1]

$$V = (E^c_{eq} - E^a_{eq}) - \frac{2.3RT}{\alpha_c zF}\log I + \frac{2.3RT}{\alpha_c zF}\log i^c_0 + \frac{2.3RT}{\alpha_c zF}\log \frac{i_{L,c} - I}{i_{L,c}} - IR_S \quad (1)$$

where
$E^c_{eq}$: cathode electrode potential [V]
$E^a_{eq}$: anode electrode potential [V]
I: current density [A/cm$^2$]
$i^c_0$: exchange current density of cathode reaction [A/cm$^2$]
$i_{L,c}$: limit diffusion current density of cathode reaction [A/cm$^2$]
$R_S$: electrolyte membrane resistance
$\alpha_c$: transfer coefficient of cathode reaction
z: number of reaction electrons in cell reaction
F: Faraday constant
R: gas constant
T: temperature [K]

FIG. 3 is a graph showing a relationship of the above equation (1). As shown in the equation (1), there are many log terms. In such a case, accuracy on a high output side becomes poor due to the influence of the log terms. Specifically, even if an attempt is made to estimate the high output side based on a low output, accuracy is deteriorated due to the influence of the log terms.

Contrary to this, the inventor focused on a fact that the IV characteristic has a high sensitivity to a pressure particularly at low temperatures and thought of reducing the influence of the log terms by increasing the pressure of the gas (at least one of the cathode gas and the anode gas) supplied to the fuel cell. Specifically, if the cathode pressure is increased, the limit diffusion current density $i_{L,c}$ of the cathode reaction tends to increase and becomes as in the following equation (2).

[Equation 2]

$$\frac{2.3RT}{\alpha_c zF}\log\frac{i_{L,c} - I}{i_{L,c}} \to 0 \quad (2)$$

Further, the exchange current density $i^c_0$ of the cathode reaction converges to a constant value. This is expressed by the following equation (3).

[Equation 3]

$$\frac{2.3RT}{\alpha_c zF}\log i^c_0 \to const \quad (3)$$

Figure 4:
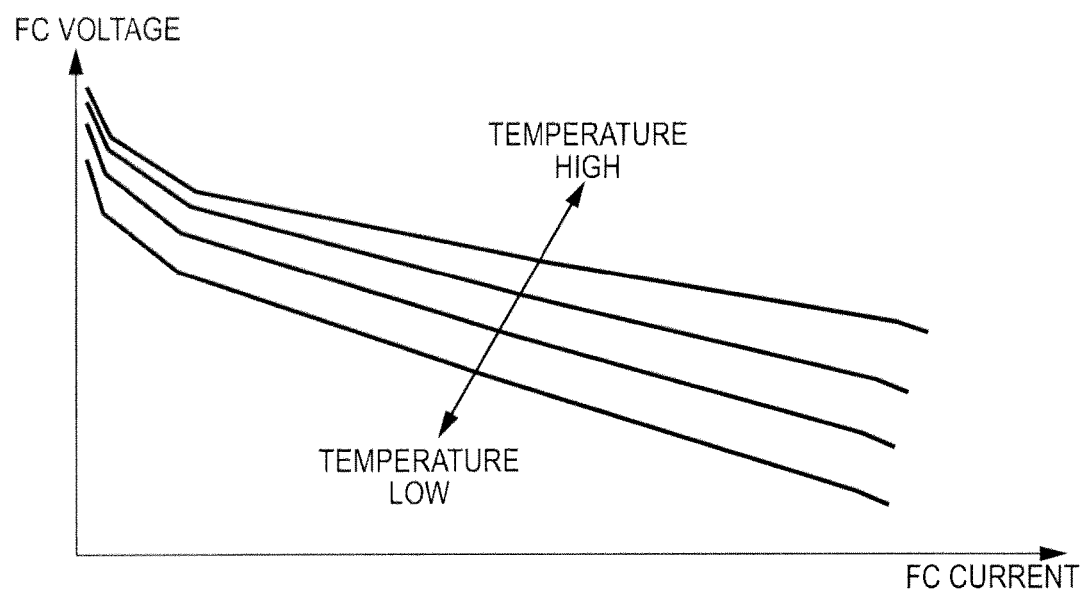
FIG. 4 is a graph showing reference power generation characteristics.

Accordingly, the influence of the log terms can be reduced by increasing the cathode pressure. The remaining log terms can be calculated as certain parameters. It should be noted that the exchange current density $i^c_0$ of the cathode reaction converges to a larger value as the temperature T increases. Further, the electrolyte membrane resistance $R_S$ increases as the temperature T decreases. Due to these influences, a reference power generation characteristic graph as shown in FIG. 4 can be obtained if the reference power generation characteristics are mapped, including the log terms.

Then, in the transient state, a current and a voltage in a range outputtable by the fuel cell without any problem are measured and deviations from the reference power generation characteristics are learned. Since these deviations are expressed by a linear function, the power generation characteristic of the fuel cell can be estimated also for a high output range. By not requesting an excessive output in accordance with the thus obtained power generation characteristic, the fuel cell can be operated without being excessively burdened.

The power generation characteristic estimation device for fuel cell embodying such a technical idea is described below.

Figure 5:
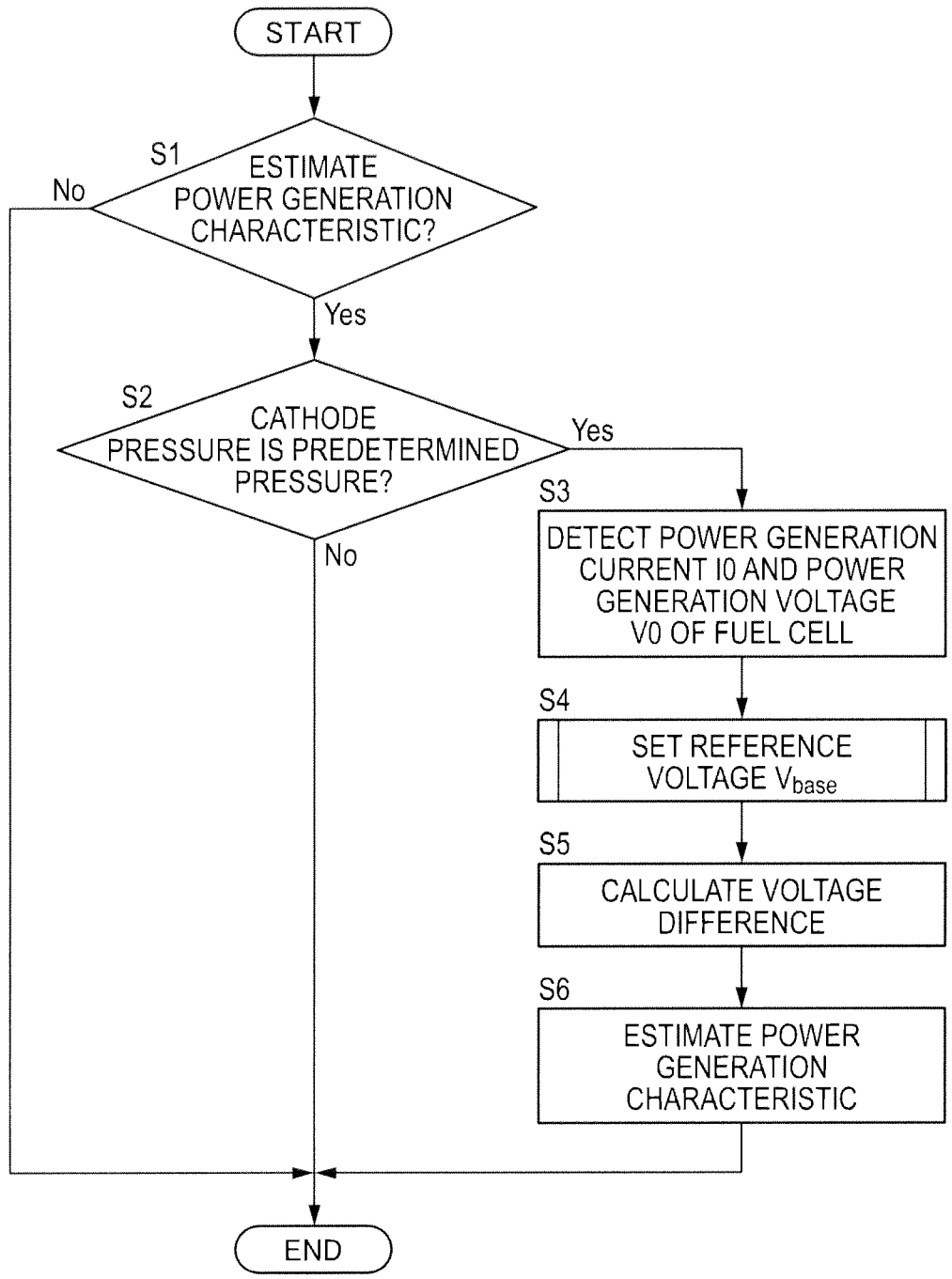
FIG. 5 is a flow chart showing the operation of a first embodiment of the power generation characteristic estimation device for fuel cell according to the present invention.

FIG. 5 is a flow chart showing the operation of the first embodiment of the power generation characteristic estimation device for fuel cell according to the present invention.

Next, the operation of the first embodiment of the power generation characteristic estimation device for fuel cell is described, focusing on the operation of the controller. In this flow chart, a series of processings for estimating the power generation characteristic are successively described. Accordingly, the controller repeatedly executes this process every time the power generation characteristic is estimated. For example, this process may be executed every ten seconds.

In Step S1, the controller determines whether or not it is necessary to estimate the power generation characteristic of the fuel cell. For example, in the case of a sub-zero start-up operation, the power generation characteristic of the fuel cell needs to be estimated. The controller proceeds the process to Step S2 if necessary while finishing the process if unnecessary.

In Step S2, the controller determines whether or not the cathode pressure is a predetermined pressure higher than a pressure in a normal operation. It should be noted that this predetermined pressure is described with reference to FIG. 6. Then, the controller finishes this routine without estimating the power generation characteristic if the cathode pressure is lower than this predetermined pressure while proceeding the process to Step S3 if the cathode pressure is not lower than the predetermined pressure.

Figure 6:
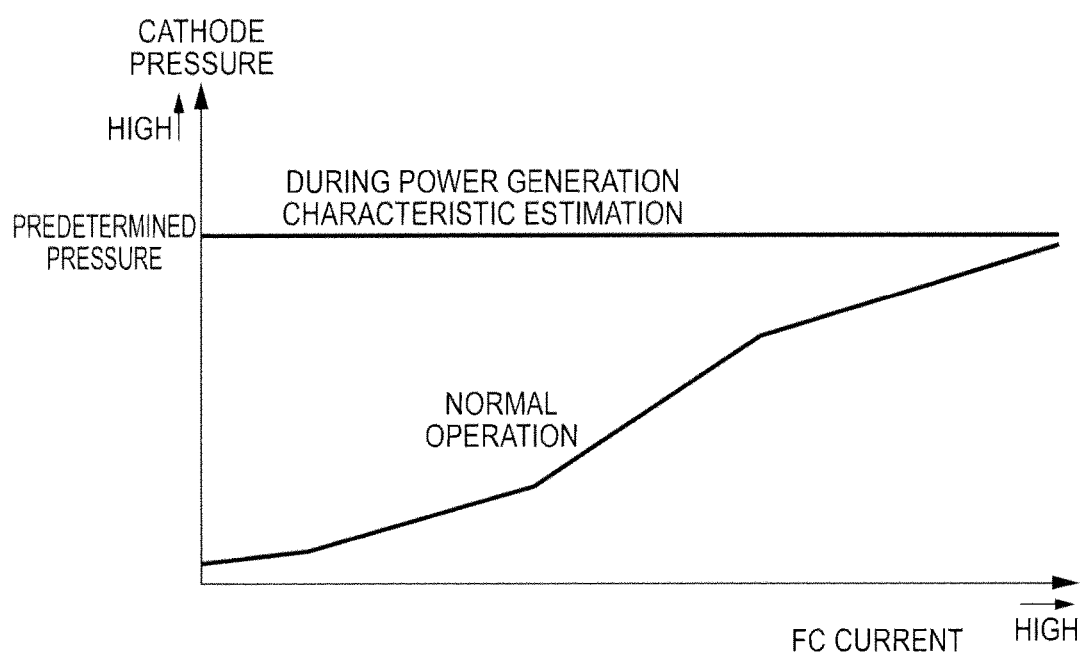
FIG. 6 is a graph showing a cathode pressure when a power generation characteristic estimation process is performed.

FIG. 6 is a graph showing the cathode pressure when the power generation characteristic estimation process is performed.

In a normal operation, the cathode pressure increases with an increase in a power generation current required for the fuel cell.

Contrary to this, in the present embodiment, the cathode pressure is set at a predetermined pressure for warm-up (maximum pressure during the operation) without depending on the power generation current in a warm-up operation unlike in the normal operation. Even in a temperature region where warm-up is performed, it leads to early warm-up due to self-heat generation associated with the power generation of the fuel cell to maximally operate strong electric load such as a compressor or a heater to promote the warm-up of the fuel cell if a travel permission cannot be issued such as at a temperature below zero and power cannot be supplied to a motor or if a driver does not request a motor torque even at a temperature above zero. Thus, it is desirable to narrow the pressure regulating valve provided on a cathode downstream side and maximize an output of the compressor in that state. The compressor and the pressure regulating valve are controlled to the above states by giving a maximum pressure during the normal operation as a target value.

As just described, if the warm-up operation is normally performed, a state preferable for IV estimation is set during the warm-up operation. The reason for determining whether or not the cathode pressure is not lower than the predetermined pressure in Step S2 is that if the normal warm-up operation is not performed even at a temperature below zero due to a certain influence, an estimation is made in a state where the cathode pressure is reduced and estimation accuracy is deteriorated.

Reference is made back to FIG. 5 again.

In Step S3, the controller detects a power generation current I0 of the fuel cell by the current sensor 101 and detects a power generation voltage V0 by the voltage sensor 102. Further, when the above detections are completed, the load of the fuel cell (or charge amount to the battery) is changed and the power generation current and the power generation voltage are detected with the power generation current I0 made different from the aforementioned one.

In Step S4, the controller sets a voltage (reference voltage) Vbase on the reference power generation characteristic at the power generation current I0. A specific setting method is described with reference to FIG. 7.

Figure 7:
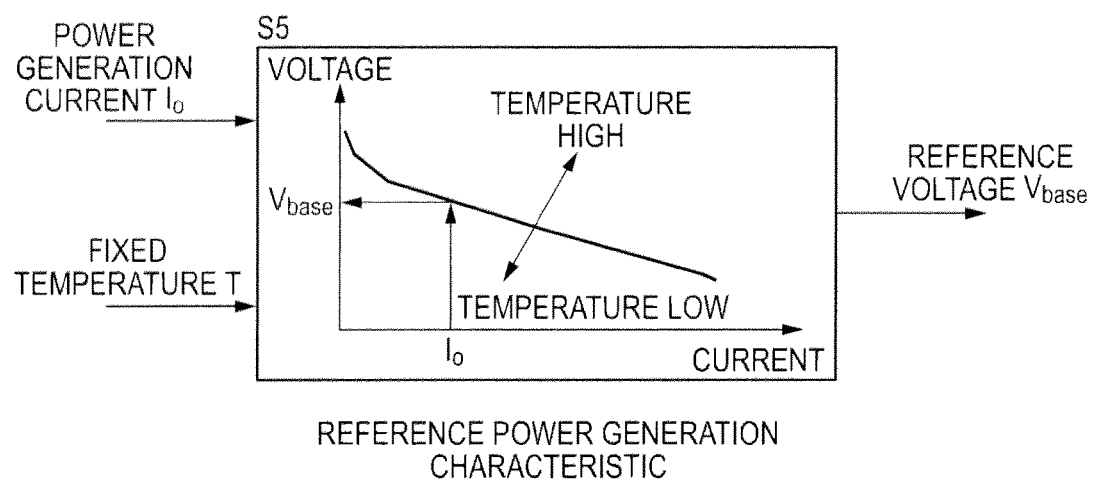
FIG. 7 is a diagram showing a reference voltage setting routine.

FIG. 7 is a diagram showing a reference voltage setting routine.

In the reference voltage setting routine (Step S4), the reference power generation characteristic at a predetermined water temperature T is utilized. The power generation characteristic of the fuel cell has no more pressure sensitivity on a high load side when the temperature becomes high. Thus, the reference power generation characteristic stored in a computer is desirably a characteristic at a temperature at which there is no pressure sensitivity. By applying the power generation current I0 to this reference power generation characteristic, the reference voltage Vbase is set. In a similar way, a reference voltage Vbase in the case of applying the changed power generation current I0 is also set.

Reference is made back to FIG. 5 again.

In Step S5, the controller calculates a voltage difference ΔV at the power generation current I0. Specifically, the voltage difference ΔV between the power generation voltage V0 and the reference voltage Vbase is calculated. Further, a voltage difference ΔV at a changed power generation current I1 is calculated in a similar way.

The processing in Step S6 is described. Concerning a deviation ΔV between a reference characteristic and a current characteristic, it was found that there was a correlation expressed by a linear function between the power generation current I0 and the voltage difference ΔV if a plurality of empirically obtained pieces of data of the voltage differences ΔV are successively processed by a least squares method. Specifically, a relationship of "ΔV=aI0+b" could be empirically obtained. Accordingly, by giving two pairs of values of the power generation current I0 and the voltage difference ΔV, the values of a coefficient a and an intercept b can be solved from the linear function. Then, all the voltage differences ΔV from the reference characteristic at each current can be obtained, wherefore the current IV characteristic can be described by subtracting the voltage difference ΔV at each current from the reference characteristic.

Figure 8:
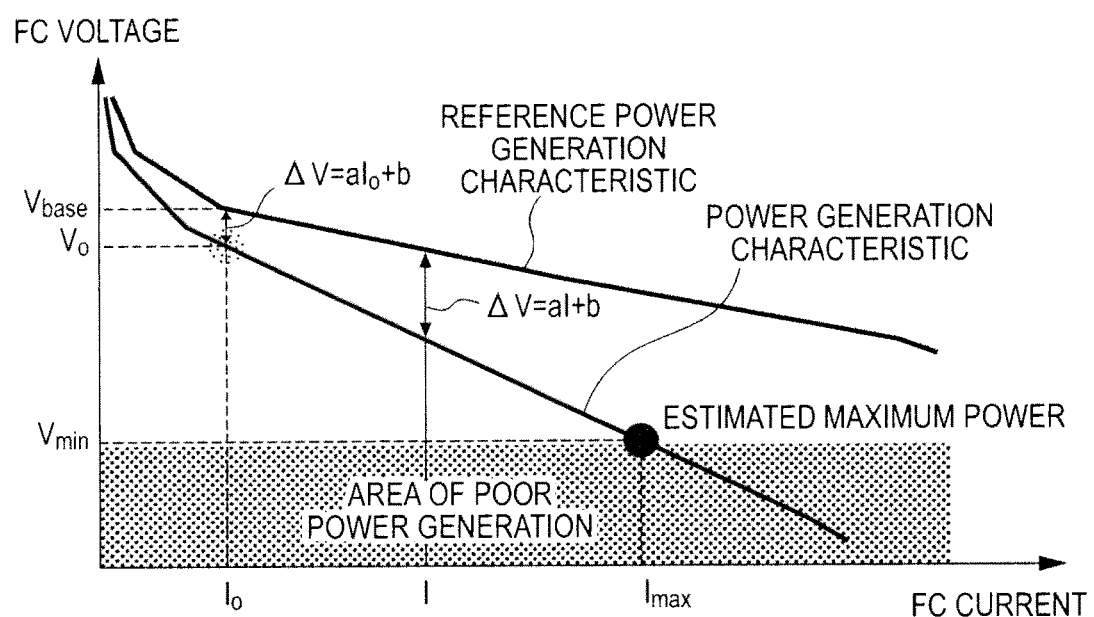
FIG. 8 is a graph showing functions and effects of the first embodiment.

If the current power generation characteristic can be estimated in this way, whether or not a voltage drop is caused if large power is supplied to the motor only by small power to the load can be accurately judged even at a temperature below zero at which power cannot be supplied to the motor as shown in FIG. 8. Thus, a travel permission can be safely and accurately issued.

Further, also after the travel permission is issued, the warm-up operation is continued at a maximum pressure for a predetermined period of time. This can suppress a possibility that the power generation characteristic on the high load side is deteriorated and a voltage drop is caused as the pressure decreases even if power is supplied to the motor immediately after the travel permission.

A maximum power generation current Imax at which the voltage is not below a minimum voltage Vmin can be obtained. Thus, if the driver's request is excessive for the fuel cell during the warm-up operation, power generation can be stably continued by restricting such a request.

In addition, since the characteristic at the predetermined temperature or higher is set as a reference and the pressure is increased by the warm-up operation in estimating an actual power generation characteristic in the present embodiment, the occurrence of such an inconvenience that the voltage difference ΔV from the reference characteristic at a high load deviates from the above linear function is prevented.

FIG. 8 is a graph showing one technique for obtaining as many pieces of data of the voltage difference ΔV as possible at the power generation current W.

It should be noted that charge/discharge power of the battery 12 may be changed to change the power generation current of the fuel cell. If the charge/discharge power of the battery is changed, the power generated by the fuel cell can be changed without changing the power consumption of the load.

Further, in the present embodiment, a and b are solved to accurately obtain the current power generation characteristic by using the linear expression of "ΔV=aI0+b" and substituting two pairs of ΔV and I0. However, by giving a predetermined value to b in advance, a can be obtained by giving one pair of ΔV and I0. Although the accuracy of the intercept may be deteriorated to a certain extent, the IV characteristic can also be estimated in this way. In this case, there is a merit of being able to estimate the IV characteristic only by changing the voltage applied to the fuel cell once.

Second Embodiment

Figure 9:
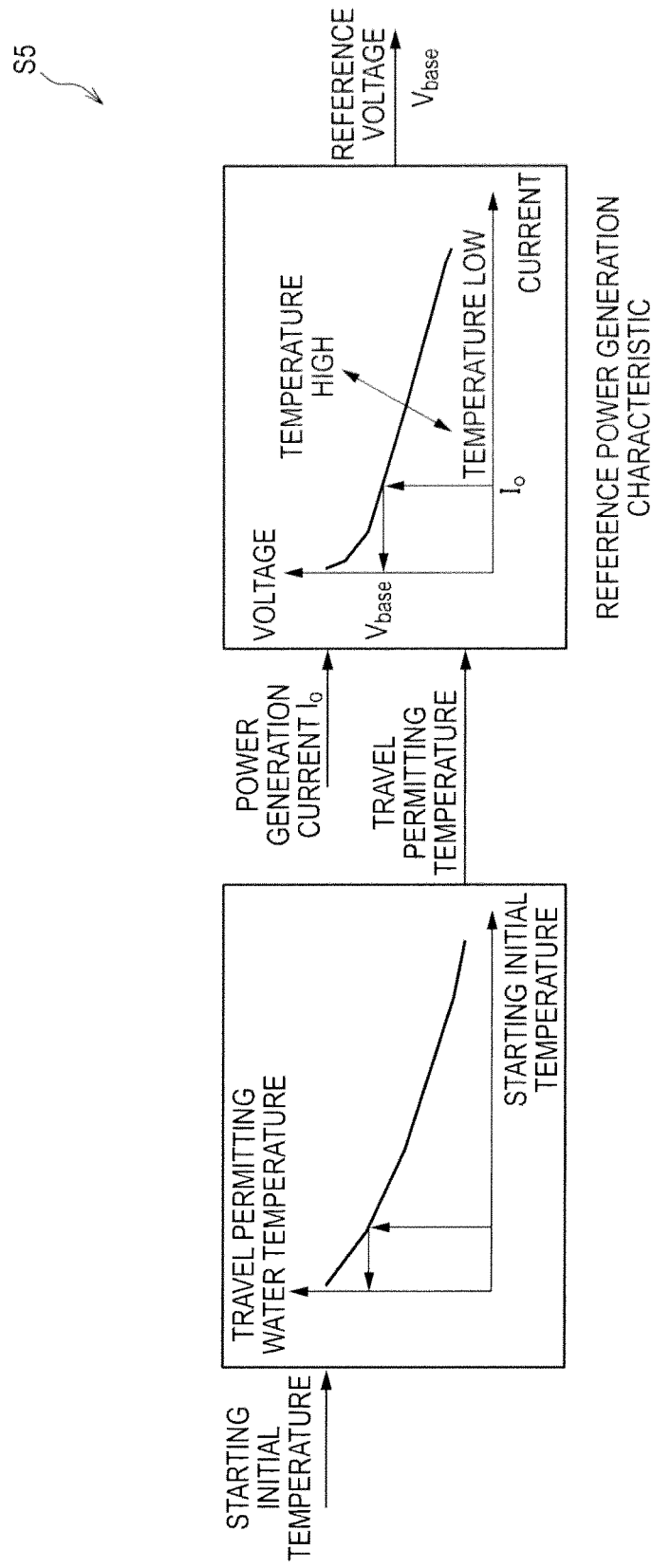
FIG. 9 is a diagram showing a reference voltage setting routine of a second embodiment of the power generation characteristic estimation device for fuel cell according to the present invention.

FIG. 9 is a diagram showing a reference voltage setting routine of a second embodiment of the power generation characteristic estimation device for fuel cell according to the present invention.

It should be noted that components having functions similar to those mentioned above are denoted by the same reference signs and repeated description is omitted as appropriate below.

In the first embodiment, the reference power generation characteristic is obtained with a water temperature T, at which the travel can be permitted, set as a target in the reference voltage setting routine (Step S4). Even in this way, reasonable effects can be obtained. Contrary to this, in the present embodiment, a reference power generation characteristic is obtained according to a water temperature in the early stage of the start-up. A reference voltage Vbase is set by applying the power generation current I0 to this reference power generation characteristic.

By doing so, the power generation characteristic of the fuel cell can be more accurately estimated. It should be noted that although the temperature needs to be accurately detected in patent literature 1, it is sufficient to detect an approximate temperature in the present embodiment. Even in such a case, the power generation characteristic of the fuel cell can be more accurately estimated as compared with the first embodiment.

Third Embodiment

Figure 10:
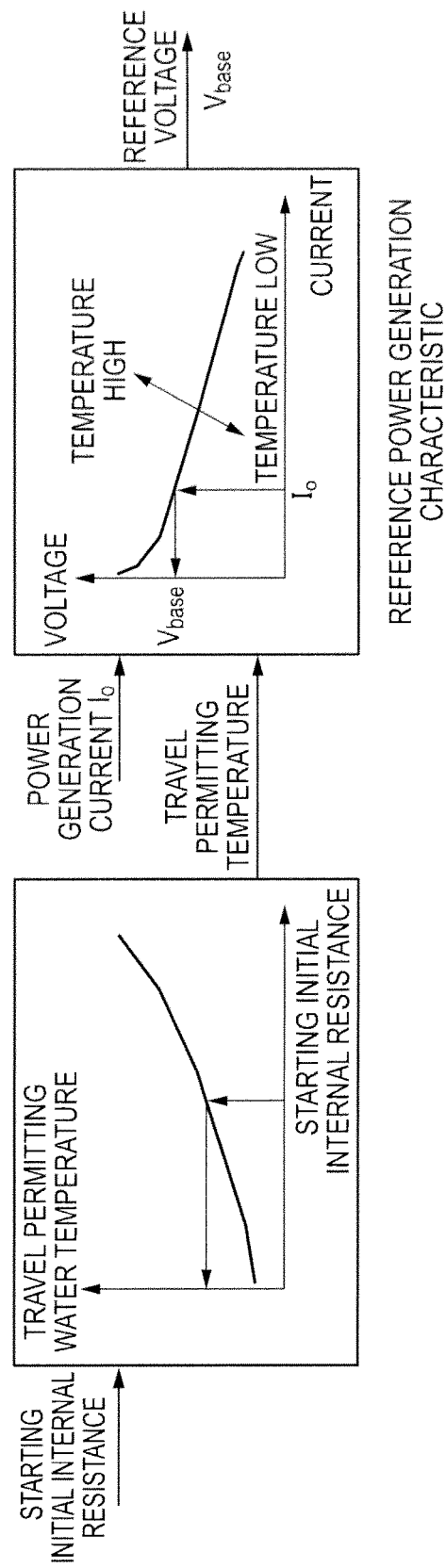
FIG. 10 is a diagram showing a reference voltage setting routine of a third embodiment of the power generation characteristic estimation device for fuel cell according to the present invention.

FIG. 10 is a diagram showing a reference voltage setting routine of a third embodiment of the power generation characteristic estimation device for fuel cell according to the present invention.

In the present embodiment, a reference power generation characteristic is obtained according to an internal resistance (electrolyte membrane resistance) in the early stage of the start-up. Specifically, a water temperature T, at which the travel can be permitted, is obtained according to the internal resistance in the early stage of the start-up. Then, the reference power generation characteristic is set based on this water temperature T. By doing so, the power generation characteristic of the fuel cell can be estimated even if the temperature of the fuel cell cannot be accurately detected. It should be noted that the internal resistance (electrolyte membrane resistance) of the fuel cell can be calculated as follows. A voltage change is observed by changing the power generation current I0, for example, by a sine wave of 1 kHz and then an AC voltage amplitude of 1 kHz is divided by an AC current amplitude to obtain the internal resistance.

Figure 11:
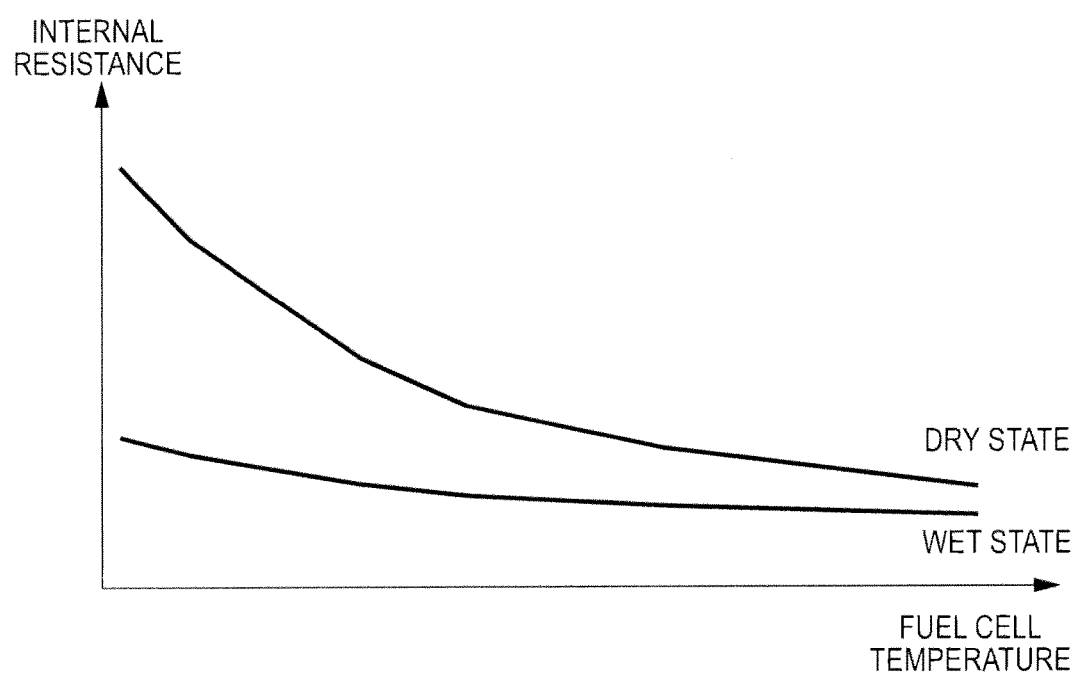
FIG. 11 is a graph showing an internal resistance (electrolyte membrane resistance) of a fuel cell.

Further, the internal resistance (electrolyte membrane resistance) of the fuel cell is higher in a dry state than in a wet state as shown in FIG. 11. This is particularly notable when the temperature of the fuel cell is low. Accordingly, an electrolyte membrane may be dried such as by extending the operation of the cathode compressor 21 when the operation of the fuel cell is stopped. By doing so, the internal resistance in the early stage of the start-up increases. Thus, an initial water temperature of the fuel cell can be more accurately grasped from the internal resistance, with the result that the power generation characteristic of the fuel cell can be more accurately estimated.

Fourth Embodiment

Figure 12:
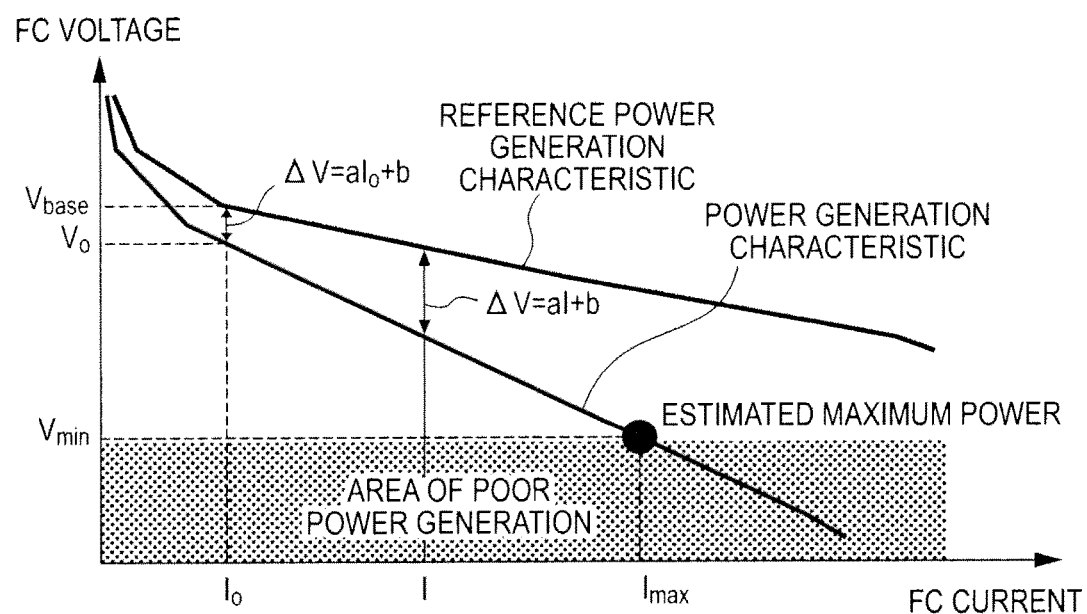
FIG. 12 is a diagram showing estimation of a power generation characteristic of a fuel cell of a fourth embodiment of the power generation characteristic estimation device for fuel cell according to the present invention.

FIG. 12 is a diagram showing an estimation of a power generation characteristic of a fuel cell of a fourth embodiment of the power generation characteristic estimation device for fuel cell according to the present invention.

In the above embodiments, the correlation expressed by the linear function, i.e. the correlation of "$\Delta V = aI0 + b$" is obtained between the power generation current I0 and the voltage difference $\Delta V$ by obtaining as many pieces of data of the voltage difference $\Delta V$ as possible at the power generation current I0 and successively processing these pieces of data by the least squares method. Contrary to this, the inventor focused on a point that "a" is the internal resistance (electrolyte membrane resistance) $R_S$ of the fuel cell. Specifically, as is understood from the above equation (1), a coefficient of a current term is $R_S$. Accordingly, the internal resistance (electrolyte membrane resistance) of the fuel cell is calculated and set as the coefficient of the current term. Further, the voltage difference $\Delta V$ is calculated described above. Since the remaining b can also be calculated from these, the correlation of $\Delta V = aI0 + b$" can be obtained.

Although many pieces of data of the voltage difference $\Delta V$ at the power generation current I0 are obtained by changing the power generation current I0 by a sine wave of 1 Hz in the first embodiment, the coefficient of the current term is calculated by changing the power generation current I0 by a sine wave of 1 kHz. By doing so, an influence on the load can be suppressed low as compared with the first embodiment.

Although the embodiments of the present invention have been described above, the above embodiments are only an illustration of some application examples of the present invention and not intended to limit the technical scope of the present invention to the specific configurations of the above embodiments.

For example, although the method for increasing, particularly, the cathode pressure as the pressure of the gas supplied to the fuel cell has been described in the above description, the anode pressure may be increased.

Further, in the above description, the correlation expressed by the linear function has been obtained between the power generation current and the voltage difference. However, without being limited to this, the current and the voltage may be reversed and a correlation expressed by a linear function may be obtained between a power generation voltage and a current difference.

Further, the above embodiments can be appropriately combined.

The invention claimed is:

1. A power generation characteristic estimation device for a fuel cell, comprising:
    a current detection unit configured to detect an actual current of the fuel cell;
    a voltage detection unit configured to detect an actual voltage of the fuel cell; and
    a controller programmed to
    set a reference power generation characteristic of the fuel cell; and
    estimate an actual power generation characteristic of the fuel cell based on a voltage difference between a voltage on the reference power generation characteristic set in accordance with the actual current detected by the current detection unit and the actual voltage detected by the voltage detection unit;
    wherein the controller is programmed to estimate the power generation characteristic during a warm-up operation of the fuel cell when a pressure of a gas supplied to the fuel cell is not lower than a predetermined pressure, a state of the fuel cell during the warm-up operation being a transient state.

2. The power generation characteristic estimation device for a fuel cell according to claim 1, wherein:
    the controller is programmed to estimate a correlation between the actual current and the voltage difference based on at least two pieces of data of the voltage difference between the voltage on the reference power generation characteristic and the actual voltage at the actual current at the predetermined pressure, and estimates the power generation characteristic of the fuel cell based on the estimated correlation and the reference power generation characteristic of the fuel cell.

3. The power generation characteristic estimation device for a fuel cell according to claim 1,
    wherein the controller is programmed to prohibit supply of power to a travel motor from the fuel cell at a temperature below zero; and
    wherein the controller is programmed to warm-up by the supply of power to a load of the fuel cell and control the pressure of the gas supplied to the fuel cell to a maximum pressure during an operation after the warm-up.

4. The power generation characteristic estimation device for a fuel cell according to claim 3,
    wherein the controller is programmed to permit the supply of power to the travel motor based on the estimation of the power generation characteristic;
    wherein the controller is programmed to continue the warm-up operation at the maximum pressure after a travel permission.

5. The power generation characteristic estimation device for a fuel cell according to claim 1, further comprising:

a resistance detection unit configured to detect an internal resistance of the fuel cell;

wherein controller is programmed to estimate a correlation between the actual current and the voltage difference based on the actual current, the voltage difference and the internal resistance and estimate the power generation characteristic of the fuel cell based on the estimated correlation and the reference power generation characteristic of the fuel cell.

6. The power generation characteristic estimation device for a fuel cell according to claim 1, wherein:

the controller is programmed to set the voltage on the reference power generation characteristic based on the reference power generation characteristic of the fuel cell at a prescribed predetermined temperature.

7. The power generation characteristic estimation device for a fuel cell according to claim 1, wherein the controller is programmed to calculate an operation permissible temperature of the fuel cell based on an internal resistance when a process for estimating the power generation characteristic of the fuel cell is started;

wherein the controller is programmed to set the voltage on the reference power generation characteristic based on the operation permissible temperature.

8. The power generation characteristic estimation device for a fuel cell according to claim 1, wherein the controller is programmed to dry an interior of the fuel cell when the fuel cell stops operating.

* * * * *